United States Patent [19]

Bee

[11] 4,349,755
[45] Sep. 14, 1982

[54] CURRENT PRODUCT LIMIT DETECTOR
[75] Inventor: Edward C. Bee, Sunnyvale, Calif.
[73] Assignee: National Semiconductor Corporation, Santa Clara, Calif.
[21] Appl. No.: 120,509
[22] Filed: Feb. 11, 1980
[51] Int. Cl.³ .......................... G06G 7/12; G06G 7/16
[52] U.S. Cl. .................................. 307/492; 307/494; 307/260; 328/145; 328/160
[58] Field of Search ............... 328/142, 144, 145, 160; 307/492, 494; 364/722, 851, 841; 324/77 F

[56] References Cited

U.S. PATENT DOCUMENTS

| | | | |
|---|---|---|---|
| 3,197,626 | 7/1965 | Platzen, Jr. | 307/492 |
| 3,304,419 | 2/1967 | Huntley, Jr. et al. | 307/492 |
| 3,678,294 | 7/1972 | Glathe | 307/492 |
| 3,805,092 | 4/1974 | Henson | 328/160 |
| 3,852,688 | 12/1974 | Takeda | 307/492 |
| 3,906,246 | 9/1975 | Okada | 328/160 |
| 3,921,008 | 11/1975 | Claveri | 328/145 |

Primary Examiner—Stanley D. Miller, Jr.
Assistant Examiner—B. P. Davis
Attorney, Agent, or Firm—Brown & Martin

[57] ABSTRACT

A circuit for detecting when the product of two independent currents equals or exceeds a predetermined upper limit is disclosed. The circuit includes a load current source for providing a load current for defining the predetermined upper limit; a differential amplifier including first and second transistors having their emitters connected in common to an emitter current source, wherein the collector of the first transistor is connected to the load current source for providing an output signal at the collector that changes state when the collector current is not less than the load current; a first combination of components for providing a voltage signal at the base of the first transistor that is representative of the natural logarithm of the reciprocal of a first independent current; and a second combination of components for providing a voltage signal at the base of the second transistor that is representative of the natural logarithm of a second independent current. Accordingly the collector current of the first transistor is proportional to the natural logarithm of the product of the first and second independent currents, and when the collector current equals or exceeds the value of the load current, the output signal is provided at the collector of the first transistor to indicate that the predetermined upper limit has been exceeded.

5 Claims, 1 Drawing Figure

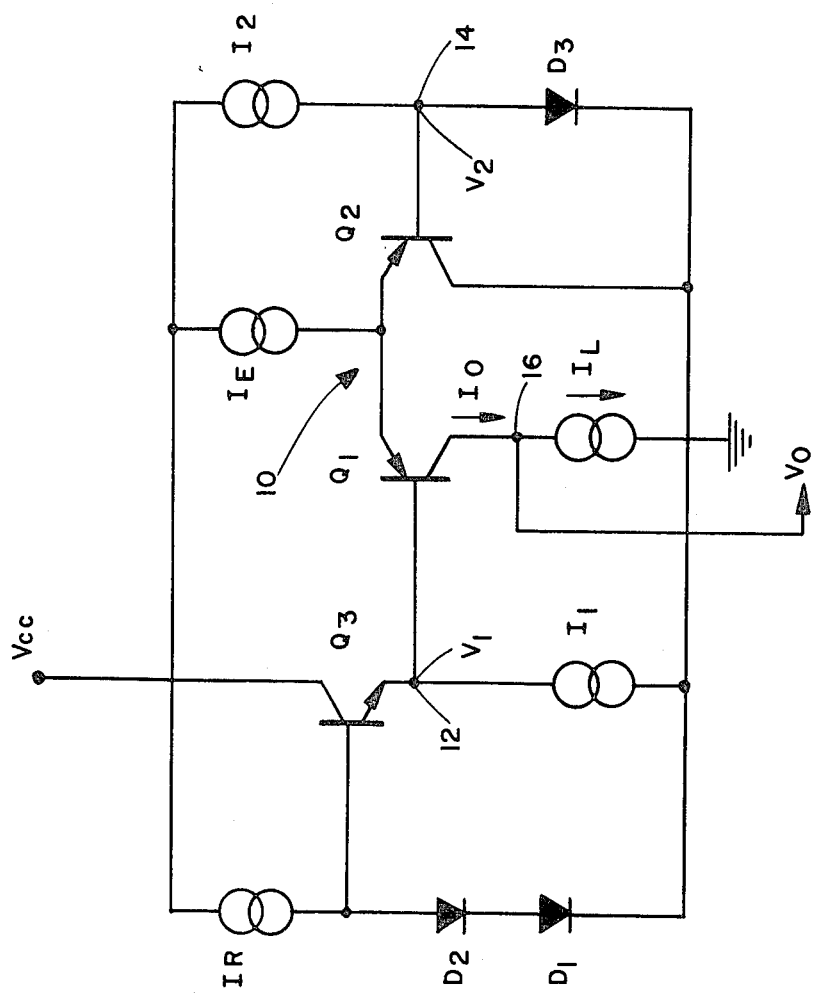

4,349,755

CURRENT PRODUCT LIMIT DETECTOR

BACKGROUND OF THE INVENTION

The present invention pertains to a current product limit detector circuit.

In order to limit power dissipation in a circuit or in given components of a circuit, it is necessary to detect when the power dissipation reaches or exceeds a predetermined level. Power dissipation in a given component is proportioned to the product of the current flowing through the component and the voltage across the component. The voltage across the component generally is proportioned to a second current flowing in the circuit. Accordingly the product of these two currents may be used as a measure of the power dissipation in the given component.

SUMMARY OF THE INVENTION

The present invention is a circuit for detecting when the product of two independent currents equals or exceeds a predetermined upper limit. The circuit includes a load current source for providing a load current for defining the predetermined upper limit; a differential amplifier including first and second input terminals for receiving voltage signals for comparison and an output terminal connected to the load current source for providing an output signal at the output terminal that changes state when the differential voltage signals applied at the input terminals is not less than the load current; a first combination of components for providing a voltage signal at the first input terminal that is representative of the natural logarithm of the reciprocal of a first independent current; and a second combination of components for providing a voltage signal at the second input terminal that is representative of the natural logarithm of a second independent current; whereby the differential amplifier output current is proportional to the natural logarithm of the product of the first and second independent currents. Thus when the differential amplifier output current equals or exceeds the value of the load current, the output signal is provided at the output terminal to indicate that the predetermined limit has been exceeded.

In the preferred embodiment, the differential amplifier includes first and second transistors having their emitters connected in common to an emitter current source, and their bases respectively connected to the first and second input terminals. The output terminal is connected to the collector of the first transistor, which is connected to the load current source for providing the output signal at the output terminal when the collector current is not less than the load current.

The theory of the present invention, together with certain additional features of the invention are discussed in relation to the description of the preferred embodiment.

BRIEF DESCRIPTION OF THE DRAWING

The FIGURE of the drawing is a schematic diagram of a preferred embodiment of the circuit of the present invention.

DESCRIPTION OF THE PREFERRED EMBODIMENT

Referring to the Drawing, the preferred embodiment of the circuit of the present invention includes a load current source $I_L$, a differential amplifier 10 that includes an emitter-coupled pair of first and second transistors Q1 and Q2; a reference current source $I_R$; a third transistor Q3; a first semiconductor junction device consisting of a pair of series-connected diodes D1 and D2; and a second semiconductor junction device consisting of a diode D3. The base terminals 12 and 14 of the first and second transistors Q1 and Q2 are the respective first and second input terminals of the differential amplifier 10; and the collector terminal 16 of the transistor Q1 is the output terminal of the differential amplifier 10. This circuit detects when the product of the two independent currents $I_1$ and $I_2$ equals or exceeds a predetermined upper limit. These two currents are represented in the drawing of the circuit as current sources $I_1$ and $I_2$.

The load current source $I_L$ provides a load current flowing to circuit ground for defining the predetermined upper limit of the product of the two independent currents. Within the differential amplifier 10, the first and second transistors Q1 and Q2 have their emitters connected in common to an emitter current source $I_E$; and the collector terminal 16 of the first transistor Q1 is connected to the load current source $I_L$ for providing an output signal $V_o$ at the collector terminal 16 when the collector current is not less than the load current $I_L$.

The third transistor Q3 is connected as an emitter follower transistor with its emitter connected in common with the source of the first independent current $I_1$ and the base terminal 12 of the first transistor Q1. The reference current source $I_R$ is connected to the base of the third transistor Q3 for biasing the third transistor Q3 to provide a voltage $V_1$ at the base terminal 12 of the first transistor Q1 that is representative of the logarithm of the reciprocal of the first independent current $I_1$.

The base terminal 14 of the second transistor Q2 is connected to the source of the second independent current $I_2$. The diode D3 is connected to the base terminal 14 of the second transistor Q2 to provide a voltage $V_2$ at the base terminal 14 of the second transistor Q2 that is representative of the logarithm of the second independent current $I_2$.

The diodes D1, D2 and D3 and the third transistor Q3 each have the same saturation current value $I_s$. All three diodes D1, D2 and D3 have the same threshold voltage characteristic $V_T$.

The theory of operation of this circuit follows. The voltage V, at the input terminal 12 of the differential amplifier 10 is:

$$V_1 = 2\,V_T \ln(I_R/I_S) - V_T \ln(I_1/I_S) \qquad (1)$$

$$V_1 = V_T \ln(I_R^2/I_1 I_S) \qquad (2)$$

The voltage $V_2$ at the input terminal 14 of the differential amplifier 10 is:

$$V_2 = V_T \ln(I_2/I_S) \qquad (3)$$

Accoringly the voltage difference across the input terminals 14 and 12 of the differential 10 is:

$$V_2 - V_1 = V_T \ln(I_1 I_2/I_R^2) \qquad (4)$$

The collector current lo of the transistor $Q_1$ is:

$$I_o = g_m(V_2 - V_1), \qquad (5)$$

wherein $g_m$, the mutual conductance of the transistor $Q_1$ and $Q_2$, is a function of the emitter current $I_E$ and the imbalance of the difference amplifier 10. At the balance point of the differential amplifier 10, $gm = I_E/4V_T$ and the collector current $I_o$ is:

$$I_o = (I_E/4V_T) \cdot V_T \ln(I_1 I_2 / I_R^2), \text{ or} \qquad (6)$$

$$I_o = (I_E/4) \cdot \ln(I_1 I_2 / I_R^2) \qquad (7)$$

Thus it is seen that, at the balance point of the differential amplifier 10, the collector current $I_o$ of the first transistor $Q_1$ is proportional to the natural logarithm of the product of the first and second independent currents $I_1$ and $I_2$. When the collector current $I_o$ becomes equal to or exceeds the predetermined upper limit of the current produced defined by the load current source $I_L$, the differential amplifier 10 changes states and provides an output signal $V_o$ at the output terminal 16 for indicating that the product of the two independent currents $I_1$ and $I_2$ has equaled or exceeded the predetermined upper limit.

When one of the two independent currents is proportional to a voltage across a given component, and the other one of the two independent voltages is proportional to the current through the given component, the output voltage signal $V_o$ indicates when the power dissipated in the given component exceeds a predetermined upper limit. The signal $V_o$ can be used to trigger a device for shutting off or otherwise limiting the operation of the given component so as to limit the power dissipation by the given component. This scheme is useful in protecting power transistors that are external to the detection circuit.

The circuit of the present invention has the advantage of being relatively independent of variations in temperature.

The value of the load current $I_L$ can be chosen as a ratio of the emitter current $I_E$ so as to set the sensibility of the circuit. If the load current $I_L$ is increased in relation to the emitter current $I_E$, the gm of the differential amplifier 10 will decrease.

The value of the fixed reference current $I_R$ also affects the balance point of the differential amplifier 10 and should be selected accordingly.

I claim:

1. A circuit for detecting when the product of two independent currents equals or exceeds a predetermined upper limit, comprising:
   a load current source for providing a load current for defining said predetermined upper limit;
   a differential amplifier including first and second transistors having their emitters connected in common to an emitter current source, wherein the collector of the first transistor is connected to the load current source for providing an output signal at said collector that changes state when the collector current is not less than said load current;
   first means for providing a voltage signal at the base of the first transistor that is representative of the natural logarithm of the reciprocal of a first independent current; and
   second means for providing a voltage signal at the base of the second transistor that is representative of the natural logarithm of a second independent current;
   whereby said collector current of the first transistor is proportional to the natural logarithm of the product of said first and second independent currents;
   wherein the first means comprises:
   a third transistor connected as an emitter follower transistor with its emitter connected in common with the source of said first independent current and the base of the first transistor; a reference current source connected to the base of the third transistor; and
   a first semiconductor junction device connected to the base of the third transistor for biasing the third transistor to provide a voltage at the base of the first transistor that is representative of the logarithm of the reciprocal of said first independent current.

2. A circuit according to claim 1, wherein the second means comprises:
   third means for connecting the base of the second transistor to the source of said second independent current; and
   a second semiconductor junction device connected to the base of the second transistor to provide a voltage at the base of the second transistor that is representative of the logarithm of said second independent current.

3. A circuit according to claim 2, wherein the first and second semiconductor devices and the third transistor each have the same saturation current value.

4. A circuit according to claim 3, wherein the first semiconductor device comprises two diodes connected in series and the second semiconductor device consists of a single diode, wherein all three diodes have the same threshold voltage characteristic.

5. A circuit for detecting when the product of two independent currents equals or exceeds a predetermined upper limit, comprising:
   a load current source for providing a load current for defining said predetermined upper limit;
   a differential amplifier including first and second transistors having their emitters connected in common to an emitter current source, wherein the collector of the first transistor is connected to the load current source for providing an output signal at said collector that changes state when the collector current is not less than said load current;
   first means for providing a voltage signal at the base of the first transistor that is representative of the natural logarithm of the reciprocal of a first independent current; and
   second means for providing a voltage signal at the base of the second transistor that is representative of the natural logarithm of a second independent current;
   whereby said collector current of the first transistor is proportional to the natural logarithm of the product of said first and second independent currents;
   wherein the second means comprises:
   third means for connecting the base of the second transistor to the source of said second independent current; and
   a second semiconductor junction device connected to the base of the second transistor to provide a voltage at the base of the second transistor that is representative of the logarithm of said second independent current.

* * * * *